(12) United States Patent
Tarn

(10) Patent No.: US 7,402,878 B2
(45) Date of Patent: Jul. 22, 2008

(54) PACKAGING METHOD FOR MICROSTRUCTURE AND SEMICONDUCTOR DEVICES

(75) Inventor: Terry Tarn, San Diego, CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/852,981

(22) Filed: May 24, 2004

(65) Prior Publication Data

US 2004/0238600 A1  Dec. 2, 2004

Related U.S. Application Data

(63) Continuation-in-part of application No. 10/443,318, filed on May 22, 2003, now abandoned.

(51) Int. Cl.
*H01L 27/088* (2006.01)
(52) U.S. Cl. ............................... 257/414
(58) Field of Classification Search ............ 257/794, 257/704, 734, 680, 778, 772, 779–780, 781–784, 257/99–100, 81–82, 414–412
See application file for complete search history.

(56) References Cited

U.S. PATENT DOCUMENTS

| | | | |
|---|---|---|---|
| 4,178,077 A | 12/1979 | Te Velde | |
| 4,309,242 A | 1/1982 | Te Velde | |
| 5,010,233 A | 4/1991 | Henschen et al. | |
| 5,140,109 A * | 8/1992 | Matsumoto et al. | 174/52.4 |
| 5,150,180 A * | 9/1992 | Yama | 257/680 |
| 5,175,409 A | 12/1992 | Kent | |
| 5,293,511 A | 3/1994 | Poradish et al. | |
| 5,527,744 A | 6/1996 | Mignardi et al. | |
| 5,621,162 A | 4/1997 | Yun et al. | |
| 5,702,764 A | 12/1997 | Kimura et al. | |
| 5,835,256 A * | 11/1998 | Huibers | 359/291 |
| 5,872,046 A | 2/1999 | Kaeriyama et al. | |
| 5,915,168 A | 6/1999 | Salatino et al. | |
| 5,938,956 A | 8/1999 | Hembree et al. | |

(Continued)

FOREIGN PATENT DOCUMENTS

EP   1097901 A2   5/2001

(Continued)

OTHER PUBLICATIONS

Tom Glenn, et al., Packaging Microscopic Machines, Machine Design, Dec. 7, 2000.

(Continued)

*Primary Examiner*—Nathan W Ha
(74) *Attorney, Agent, or Firm*—W. James Brady, III; Frederick J. Telecky, Jr.

(57) ABSTRACT

A novel method of packaging electronic devices (e.g. any device that receives or transmits electronic signals) including microelectromechanical devices, semiconductor devices, light emitting devices, light modulating devices, light modulating devices, and light detecting device has been provided herein. The electronic device is placed between two substrates, at least one of which has a cavity for holding the electronic device. The two substrates are then bonded and hermetically sealed with a sealing medium. The adhesion of the sealing medium to the substrates, especially when one of the two substrates is ceramic, can be improved by applying a metallization layer to the surface of the substrate.

54 Claims, 7 Drawing Sheets

U.S. PATENT DOCUMENTS

| | | | |
|---|---|---|---|
| 5,952,572 | A | 9/1999 | Yamashita et al. |
| 5,963,289 | A | 10/1999 | Stefanov et al. |
| 5,998,242 | A | 12/1999 | Kirkpatrick et al. |
| 6,046,840 | A | 4/2000 | Huibers |
| 6,062,461 | A * | 5/2000 | Sparks et al. ............ 228/123.1 |
| 6,072,236 | A | 6/2000 | Akram et al. |
| 6,164,837 | A | 12/2000 | Haake et al. |
| 6,165,885 | A | 12/2000 | Gaynes et al. |
| 6,207,548 | B1 | 3/2001 | Akram et al. |
| 6,232,150 | B1 | 5/2001 | Lin et al. |
| 6,252,229 | B1 | 6/2001 | Hays et al. |
| 6,255,739 | B1 * | 7/2001 | Adachi et al. ............... 257/788 |
| 6,265,246 | B1 | 7/2001 | Ruby et al. |
| 6,287,940 | B1 | 9/2001 | Cole et al. |
| 6,297,072 | B1 * | 10/2001 | Tilmans et al. .............. 438/106 |
| 6,303,986 | B1 | 10/2001 | Shook |
| 6,323,550 | B1 | 11/2001 | Martin et al. |
| 6,353,492 | B2 | 3/2002 | McClelland et al. |
| 6,384,473 | B1 | 5/2002 | Peterson et al. |
| 6,436,853 | B2 * | 8/2002 | Lin et al. .................... 438/800 |
| 6,458,627 | B1 | 10/2002 | Choi |
| 6,459,523 | B2 | 10/2002 | Ueda |
| 6,528,344 | B2 | 3/2003 | Kang |
| 6,541,832 | B2 | 4/2003 | Coyle |
| 6,614,003 | B2 | 9/2003 | Hembree et al. |
| 6,624,003 | B1 | 9/2003 | Rice |
| 6,649,446 | B1 | 11/2003 | Goetz et al. |
| 6,661,084 | B1 | 12/2003 | Peterson et al. |
| 6,674,159 | B1 * | 1/2004 | Peterson et al. ............. 257/680 |
| 6,696,669 | B2 * | 2/2004 | Hembree et al. ............ 219/209 |
| 6,704,131 | B2 | 3/2004 | Liu |
| 6,724,143 | B2 * | 4/2004 | Chen et al. .................. 313/512 |
| 6,758,610 | B2 * | 7/2004 | Ziari et al. ................... 385/92 |
| 6,791,735 | B2 | 9/2004 | Stappaerts |
| 6,809,413 | B1 * | 10/2004 | Peterson et al. ............. 257/680 |
| 6,810,899 | B2 | 11/2004 | Franz et al. |
| 6,858,943 | B1 * | 2/2005 | Peterson et al. ............. 257/784 |
| 6,869,007 | B2 | 3/2005 | Jin et al. |
| 6,917,461 | B2 * | 7/2005 | Malone ...................... 359/291 |
| 6,933,505 | B2 * | 8/2005 | Vuorela ................. 250/370.13 |
| 2001/0007372 | A1 | 7/2001 | Akram et al. |
| 2001/0022207 | A1 | 9/2001 | Hays et al. |
| 2001/0034076 | A1 | 10/2001 | Martin |
| 2001/0040675 | A1 | 11/2001 | True et al. |
| 2001/0048064 | A1 | 12/2001 | Kitani |
| 2002/0063322 | A1 | 5/2002 | Robbins et al. |
| 2002/0117728 | A1 | 8/2002 | Bronihhan et al. |
| 2002/0180016 | A1 | 12/2002 | Shrauger et al. |
| 2003/0000737 | A1 | 1/2003 | Liu et al. |
| 2003/0008477 | A1 | 1/2003 | Kang et al. |
| 2003/0047533 | A1 | 3/2003 | Reid et al. |
| 2003/0089394 | A1 * | 5/2003 | Chang-Chien et al. ........ 137/14 |
| 2003/0104651 | A1 * | 6/2003 | Kim et al. ................... 438/106 |
| 2003/0161027 | A1 | 8/2003 | Kurosawa et al. |
| 2003/0211654 | A1 | 11/2003 | Kocain et al. |
| 2004/0035840 | A1 | 2/2004 | Koopmans |
| 2004/0067604 | A1 | 4/2004 | Ouellet et al. |
| 2004/0188124 | A1 * | 9/2004 | Stark .......................... 174/52.3 |
| 2004/0190112 | A1 | 9/2004 | Huibers |
| 2004/0232335 | A1 | 11/2004 | Tarn |
| 2004/0256719 | A1 * | 12/2004 | Lei ............................. 257/706 |
| 2005/0142685 | A1 * | 6/2005 | Ouellet et al. ................. 438/51 |

FOREIGN PATENT DOCUMENTS

| | | |
|---|---|---|
| EP | 1101730 A2 | 5/2001 |
| EP | 1167281 A2 | 1/2002 |
| JP | 2001129800 A | 5/2001 |
| JP | 2001144117 A | 5/2001 |
| JP | 2001196484 A | 7/2001 |
| WO | WO-01/10718 A1 | 2/2001 |
| WO | WO-01/20671 A1 | 3/2001 |
| WO | WO-02/12116 A2 | 2/2002 |
| WO | WO-02/12116 A3 | 2/2002 |

OTHER PUBLICATIONS

Balaji Sridharan, et al., Post-Packaging Release a New Concept for Surface Micromachined Devices, Mechanical and Aerospace Engineering Department, 4 pgs.

U. Gosele, et al., Wafer Bonding for Microsystems Technologies, Sensors and Actuators 74 (1999) pp. 161-168.

Masao Segawa, et al., A CMOS Inage Sensor Module Applied for a Digital Still Camera Utilizing the Tab on Glass (TOG) Bonding Method, IEEE Transactions on Advanced Packaging, vol. 22., No. 2.

In-Byeong Kang, et al., The Application of Anisotropic Conductive Films for Realisation of Interconnects in Micromechanical Structures, SPIE vol. 3321, pp. 233-238.

Sonja van der Groen, et al., CMOS Compatible Wafer Scale Adhesive Bonding for Circuit Transfer, International Conference on Solid-State Sensors and Actuators, Chicago, Jun. 16-19, 1997, pp. 629-632.

G. Blink, et al., Wafer Bonding With an Adhesive Coating, Part of the SPIE Conference on Micromachined Devices and Components IV, Santa Clara, California,Sep. 1998, pp. 50-61.

Christine Kallmayer, et al., A New Approach to VHIP Size Package Using Meniscus Soldering and FPC-Bonding, IEEE Transactions on Components Packaging and Manufacturing Technology-Part C., vol. 21, No. 1., Jan. 1998, pp. 51-56.

Joachim Kloeser, et al., Low Cost Bumping by Stencil Printing: Process Qualification for 200 UM Pitch, 1998 International Synposium on Microelectronics, 11 Pgs.

Michel M. Maharbiz, et al., Batch Micropackaging by Conpression-Bonded Wafer-Wafer Transfer, Microassembly Technologies, Inc, 8 Pgs.

Bharat Shivkumar et al., Microrivets for MEMS Packaging:Concept, Fabriaction, and Strength Testing, Journal of Microlectroomechanical Systems, vol. 6, No.3, Sep. 1997, pp. 217-224.

Hideki Takagi, et al., Room Temperature Silicon Wafer Direct Bonding in Vacuum by Ar Beam Irradiation, Mechanical Engineering Laboratory, AIST. MITI., 6 Pgs.

Michael H. Beggans, et al., Optical Pressure Sensor Head Fabrication Using Ultra-Thin Silicon Wafer Anodic Bonding, Part of the Symposium on Design, Test, and Microfabrication of MEMS and MOEMS, 10 Pgs.

T.P Glenn, et al, Designing MEMS Into Systems:Packaging Issues, http://www.ecnmag.com, 4 Pgs.

Espinosa et al., ."Identification of Residual Stress State in an RF-MEMS Device", MTS Systems Corporation white paper (May 2000).

Franka et al., "Solder BumpTtechnololgy: Present and Future", Semiconductor Fablech (May 1995).

Glenn et al., "Packaging Microscopic Machines", Machine Design (Dec. 7, 2000).

Harsh et al., "Flip-Chip Assembly for SI-Based MEMS", Proceedings of the 1999 IEEE International Conference on Microelectromechanical Systems (MEMS '99), Orlando, FL (Jan. 17-21, 1999), pp. 273-278.

Irwin et al., "Quick Prototyping of Flip Chip Assembly with MEMS", University of Colorado at Boulder white paper (Jul. 17, 2000).

.Irwin et al., "Quick Prototyping of Flip-Chip Assembly with MEMS", portions of slide presentation from the NSF Center for Advanced Manufacturing and Packaging of Microwave, Optical and Digital Electronics at the University of Colorado at Boulder (1998).

Lee et al., "High-Q Turnable Capacitors and Multi-way Switches Using MEMS for Millimeter-Wave Applications", portions of slide presentation from the NSF Center for Advanced Manufacturing and Packaging of Microwave, Optical and Digital Electronics at the University of Colorado at Boulder (Sept. 1998).

Lee et al., "Use of Foundry Services to Prototype MEMS for Millimeter-wave Applications", portions of slide presentation from the NSF Center for Advanced Manufacturing and Packaging of Microwave, Optical and Digital Electronics at the University of Colorado at Boulder (1998).

Luxbacher, T., "Spray Coating for MEMS, Interconnect & Advanced Packaging Applications", HDI Magazine (May 1999) (abstract only).

Moore, D., "Automation Requirements for Die Bonding Process", Electronics Engineer (Jul. 2000).

TSAU, C., "Wafer-Level Packaging", MIT Microsystems Technology Laboratories Annual Report (May 2000), p. 49.

Y.T. Cheng, et al.," Localized Silicon Fusion and Eutectic Bonding for MEMS Fabrication and Packaging", Journal of Microelectromechanical Systems, vol.9, No. 1, Mar. 2000, pp. 3-8.

Liwei Lin, " MEMS Post-Packaging by Localized Heating and Bonding", 2000 IEEE, pp. 608-616.

Farhad Sarvar, et al., Application of Adhesives in MEMS and MOEMS Assembly: A Review, IEEE Polytronic 2002 Conference, pp. 22-28.

Seong-A Kim, et al., "Closed Loop Solder-Lines on Heated Substrates", 2002 Electronic Components and Technology Conference, pp. 1101-1105.

Giles Huimpston and David M. Jacobson, "Principles of Soldering and Brazing", ASM International, pp. 242-245- 7.3.2.3 Solution.

Duck-Jung Lee, et al., "Development of In-line Sealing Method for Plasma Display Panel", SID 02 Digest, pp. 412-415.

Sang Jik Kwon, et al., Vacuum In-Line Sealing Technology with Auxiliary Heating Line for PDP Packaging, SID 02 Digest. pp. 320-323.

Chang-Chien, et al., "Wafer-Level packaging and frequency trimming by localized mass deposition", Abstract.

US 6,724,518, 04/2004, Meyer et al. (withdrawn)

* cited by examiner

PACKAGING METHOD FOR MICROSTRUCTURE AND SEMICONDUCTOR DEVICES

CROSS-REFERENCES TO RELATED APPLICATIONS

This patent application is a continuation-in-part of U.S. patent application Ser. No. 10/443,318 to Tarn, filed May 22, 2003 now abandoned, the subject matter being incorporated herein by reference.

TECHNICAL FIELD OF THE INVENTION

The present invention is generally related to the art of packaging methods for electronic devices (e.g. any device that receives or transmits electronic signals) including microelectromechanical devices, semiconductor devices, light emitting devices, light modulating devices, or light detecting devices, and more particularly, to packaging methods for such devices particularly those that are temperature sensitive during packaging.

BACKGROUND OF THE INVENTION

Microstructures, such as microelectromechanical devices, have many applications in basic signal transduction. For example, a spatial light modulator based on a microelectromechanical device (MEMS) modulates light beams in response to electrical or optical signals. Such a modulator can be a part of a communication device or an information display. For example, micromirrors are key components of MEMS-based spatial light modulators. A typical MEMS-based spatial light modulator usually consists of an array of miniature reflective deflectable micromirrors. These micromirrors can be selectively deflected in response to electrostatic forces so as to reflect incident light by individual micromirrors for producing digital images. Such micromirrors, however, are sensitive to temperature and contamination, such as moisture and dust. This contamination has varying effects on the micromirrors, from capillary-condensation and post-release stiction to deterioration of the micromirror surfaces, which may result in mechanical failure of the micromirror devices in operation. For this and other reasons, micromirror devices are often packaged after releasing.

Regardless of differences of the packaging methods currently developed for a micromirror array device, two substrates, one for supporting the device and another one for covering the device, and sealing medium(s) for bonding the two substrates are utilized. Most of the sealing mediums require application of heat during bonding and sealing. The heat, however, may degrade the micromirror array device if not properly applied, especially for those microstructures and semiconductor devices that are temperature sensitive. For example, improperly applied heat may change the desired mechanical properties of the microstructures. It may also thermally activate particles, such as impurities and particles making up the functional components of the microstructures, prompting diffusion of these activated particles within the microstructures, thus exacerbating degradation of the microstructures. Or heat may decrease anti-stiction materials within the package.

Therefore, a method and an apparatus are needed for packaging microstructure, semiconductor, light emitting device, light modulating device, or light detecting device, particularly those that are temperature sensitive during packaging.

SUMMARY OF THE INVENTION

In view of the forgoing, the present invention provides a method of packaging microstructures that are temperature sensitive during packaging.

As an example of the invention, a package of a microelectromechanical device is provided. The package comprises: two substrates, at least one of which has a cavity holding the microelectromechanical device, wherein the two substrates are bonded together and hermetically sealed with at most one hermetic sealing layer therebetween.

As another example of the invention, a method of packaging a micromirror array device is disclosed. The method comprises: attaching the micromirror array device on a supporting surface in a cavity of one of two substrates, one of which has at least a portion that is transmissive to visible light; depositing a metallization material on a surface of at least one of the two substrates for metalizing the surface; depositing a hermetic sealing material on a surface of one of the two substrates, wherein the hermetic sealing material has a soldering temperature equal to or higher than 180° C. degrees; and bonding and hermetically sealing the two substrates.

As yet another example of the invention, a package of a semiconductor device is provided, which comprises: at least two substrates, at least one of which has a cavity holding the semiconductor device, wherein the two substrates are bonded together and hermetically sealed with at most one hermetic sealing layer therebetween.

As yet another embodiment of the invention, a method of packaging a semiconductor device is disclosed, which comprises: attaching the micromirror array device on a supporting surface in a cavity of one of two substrates, one of which has at least a portion that is transmissive to visible light; depositing a metallization material on a surface of at least one of the two substrates for metalizing the surface; depositing a hermetic sealing material on a surface of one of the two substrates, wherein the hermetic sealing material has a soldering temperature equal to or higher than 180° C. degrees; and bonding and hermetically sealing the two substrates.

As yet another example of the invention, a method for packaging a semiconductor device is provided, which comprises: depositing on a first and second substrate: a first layer of Ti, Cr, $TiO_x$ or $CrO_x$; a second layer of Ni or Pt; and a third layer of gold; bonding the first and second substrates together with a solder material that has a soldering temperature of at least 180° C. degrees.

The method of the present invention can be implemented in microstructure and semiconductor devices that are temperature sensitive during packaging.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

FIG. 9b is a diagram schematically illustrating an exemplary micromirror array consisting of the micromirror of FIG. 9a;

FIG. 10b is a diagram schematically illustrating an exemplary micromirror array consisting of the micromirror of FIG. 10a.

DETAILED DESCRIPTION OF THE INVENTION

The present invention will be discussed in the following with reference to packages of micromirror array devices and packaging processes for making the same. The following description is based on selected examples of the invention and should not be interpreted as a limitation of the invention with regard to alternative embodiments that are not explicitly described herein. In particular, although not limited thereto, the present invention is particularly useful for packaging microstructures, semiconductor devices, such as circuits formed on a semiconductor substrate, light emitting devices, such as LEDs and OLEDs, light modulators, such as MEMS-based mirror arrays, LCDs, LCOS, and optical switches, light detecting devices, such as image sensors, or detectors (e.g. CCDs). Other variations without departure from the sprit of the present invention may also be applicable.

Figure 1:
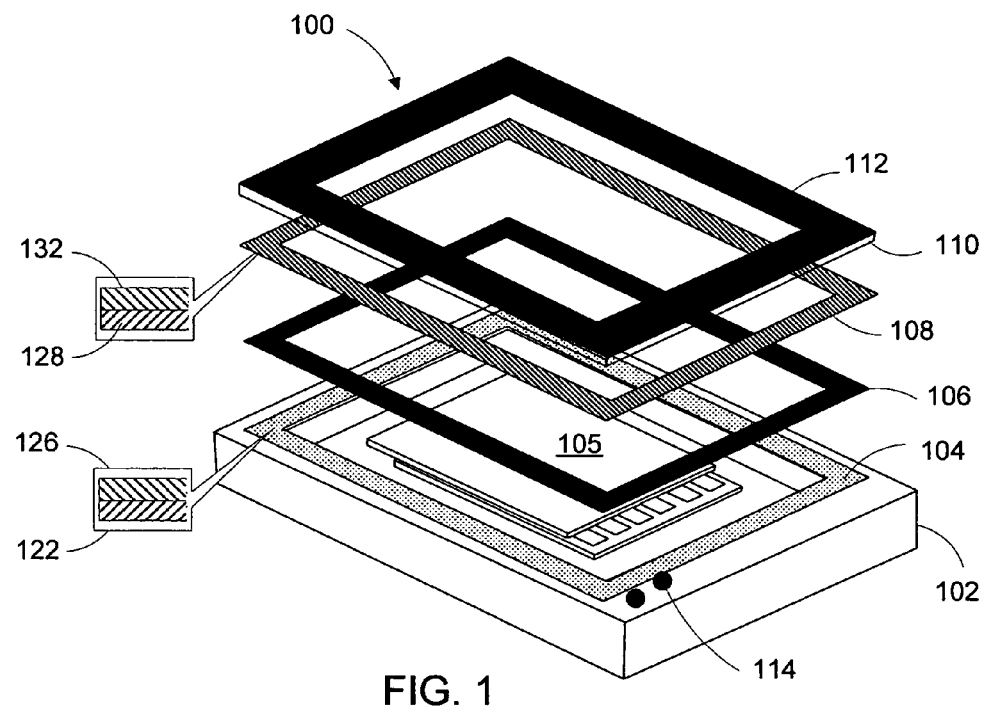
FIG. 1 is a diagram schematically illustrating an exemplary micromirror array package according to an embodiment of the invention.

Referring to FIG. 1, an exemplary package for a micromirror array device according to the present invention is illustrated therein. The package comprises package substrate 102 and cover substrate 110. In this particular example, the package substrate has a cavity for holding the micromirror array device (e.g. micromirror array device 105), and the cover substrate is a glass or quartz or other plate that is preferably transmissive to visible light. In another example, the cover substrate can be a concave cover cap (not shown) with the lower surface of the cover substrate extended towards the opposite surface (e.g. the top surface) of the cover substrate. In this case, the cover cap and the package substrate can form a space for accommodating the micromirror array device.

In order to bond and seal (preferably hermetically seal) the cover substrate and the packaging substrate, sealing medium 106 is disposed between the substrates. The sealing medium is preferably a material that is stable, reliable, cost-effective and has good thermal-properties (e.g. co-efficient of thermal expansion (CTE), thermal-conductivity etc.) compatible with the other components, such as the package substrate and/or the cover substrate. The sealing material can be an inorganic material, such as a metal, a metal alloy, a metal compound (e.g. a metal or metalloid oxide) or a glass frit. It is preferred that the sealing medium has a melting temperature of 160° C. or higher, or 180° C. degrees or higher, or even 200° C. or higher for reliable seal quality. Or it is preferred that the soldering temperature of the sealing medium is 190° C. or higher, or 210° C. or higher or even 230° C. or higher. An advantage of using a sealing medium having high melting (or soldering) temperature is that the sealing quality will not degrade, especially in the following package treatments such as package baking. Exemplary sealing mediums comprise glass frit, such as Kyocera KC-700, $BiIn_x$, $AuSn_x$, Au, $BiSn_x$, $InAg_x$, $PbSn_x$, and copper. It is preferred that the sealing medium comprises tin or lead. In addition, a glass frit, such as Kyocera KC-700 can also be used as the sealing medium. Most solderable metallic materials, however, have poor adhesion to oxide materials that often compose the surfaces of the substrates (e.g. the package substrate and the cover substrate). To solve this problem, a metallization layer can be provided to the surface of the bonding substrates of the substrates before applying the solderable metallic sealing mediums.

As shown in the figure, metallization layer 104 is applied to the top surface of the package substrate for metalizing said top surface. The metallization layer is preferably composed of a material with a high soldering temperature, such as 180° C. degrees or higher, due to many reasons. For example, the soldering temperature of the sealing material is often higher than 170° C. degrees. And after the soldering, the package could be baked if desire at a temperature higher than 100° C., such as 140° C. or higher—preferably 120° C. to 160° C. Exemplary metallization materials are aluminum, gold, nickel, or composition of two or more of suitable metallic elements, such as $AuNi_x$. These materials can be deposited on the surfaces as thick or thin films using suitable deposition methods, such as sputtering printing or pasting. In an example of the invention, the metallization medium layer is a thin layer of noble metallic material, such as gold. This metallization medium layer is preferably sputtered as a film on the lower surface of the cover substrate.

Metallization layer 104 metalizes the top surface of package substrate 102 for improving adhesion of sealing medium 106 to the top surface of the package substrate. For the same reason, another metallization layer 108 can be provided between the sealing medium and cover substrate 110 for improving the adhesion of the sealing medium to the lower surface of the cover substrate. Metallization layer 108 may or may not be the same as metallization layer 104 depending upon the selected sealing medium and the cover substrate.

In another example of the invention, metallization layers 104 and 108, each can be a multilayered structure, e.g. comprising metal-oxides (e.g. $CrO_2$ and $TiO_2$) and/or elemental metals (e.g. Cr, Au, Ni, and Ti). As shown in FIG. 1, metallization layer may comprise layers 122 and 126; and metallization layer may comprise layers 128 and 132. The metallization layers (104 and 108) may or may not be multilayered structures at the same time. Specifically, one of the two metallization layers can be a single layer, while the other can be a multilayered structure. Or both metallization layers can be either single layers or multilayered structure.

When the metallization layer comprises metal-oxide and metallic layers, the metal-oxide layer is first deposited on the surface of the non-metallic substrate (such as ceramic or glass), because it presents strong adhesion to the non-metallic substrate's surface, which is generally oxidized. The metallic layer is then attached to the metal-oxide layer. As another example, the metallization layers (104 and/or 108) each may comprise a $CrO_x$ layer (e.g. layer 112) followed by a Cr layer (or a Ti layer), followed by a Ni layer (or Pt layer) and then followed by an Au layer. The $CrO_2$ layer is provided as a light blocking frame for absorbing scattered light. Cr layer is provided for improving the adhesion of the succeeding metallic layers to the $CrO_2$ layer. The Ni layer is provided as a metallization layer. Because the Ni layer is easily oxidized, the Au layer is provided for preventing such oxidation. The Ni layer may be deposited as a thick layer for improving the bond of the solder layer to the substrate (or the cover substrate). However, a thick Ni layer may cause extra stress or distortion to the package system. To avoid this, one or more Au layers can be inserted into the thick Ni layer, resulting in an alternating Ni, Au, Ni, and Au layers. Also, the $CrO_2$ layer can be formed by forming a Cr layer followed by oxidation of the formed Cr layer, which can also be followed by the Ni (or Pt) layer.

In addition to the light blocking frame, an anti-reflection (AR) film may be employed on the glass cover substrate or on the light transmissive window (when the cover substrate is not light transmissive) for improving the light transmission. The AR-film can be deposited on either surface of the glass substrate (or the glass window or both). When the AR-film is coated on the lower surface of the glass substrate, it is preferred that the AR-film does not cover the periphery portion to which the metallization material (108) is to be applied, because the AR-film may degrade the adhesion of the metallization material to the surface of the cover substrate. In fabrication, the AR-film can be deposited on the lower surface of the glass substrate before or after deposition of the metallization material.

Figure 2:
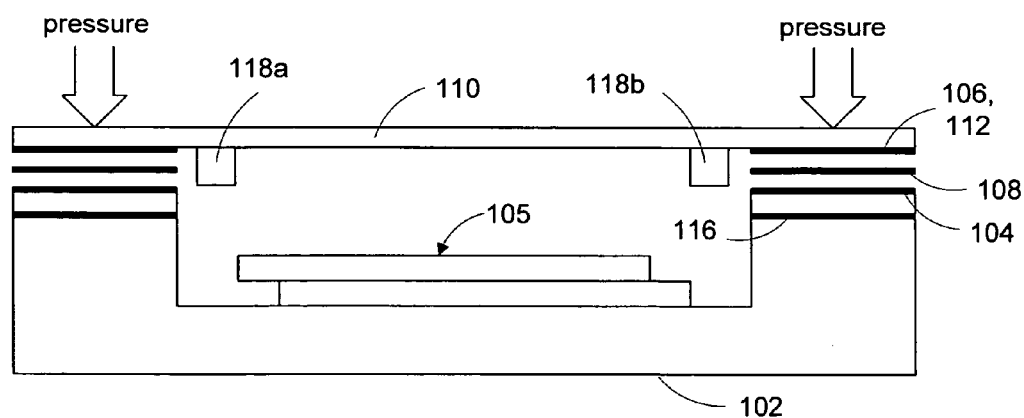
FIG. 2 is a cross-sectional view of the FIG. 1.

During the bonding process, external forces, such as external pressure, heat, or radiation may be applied to the cover substrate, as shown in FIG. 2, wherein a cross-sectional view of FIG. 1 is illustrated therein. After a predetermined time period when the cover substrate and the packaging substrate are securely bonded, the external forces can be withdrawn, but not necessarily at the same time. As shown in FIG. 2, getter 118a for absorbing gases, moisture and/or impurity particles (e.g. organic particles), and lubricant 118b for lubricating the surfaces of the microstructures (e.g. micromirror array device) can be provided within the package.

Because the metallization layer(s) (104 and/or 108) and the sealing medium (106) preferably have high soldering or melting temperatures (e.g. 180° C. degrees or higher), a localized heating mechanism along the periphery of the substrate(s) can be provided. A significant benefit of such localized heating mechanism is that the heat is localized around the periphery of the substrates, and the temperature sensitive microstructure in the package will not be thermally disturbed. The localized heating mechanism can be formed in many ways, as set forth in U.S. patent application Ser. No. 10/443,318 to Tarn, filed May 22, 2003, the subject matter of which is incorporated herein by reference. As an example of the invention, the localized heating mechanism is an integral or embedded heater on or in the package substrate (102), which will be discussed in the following with reference to FIGS. 3 to 6.

Figure 3:
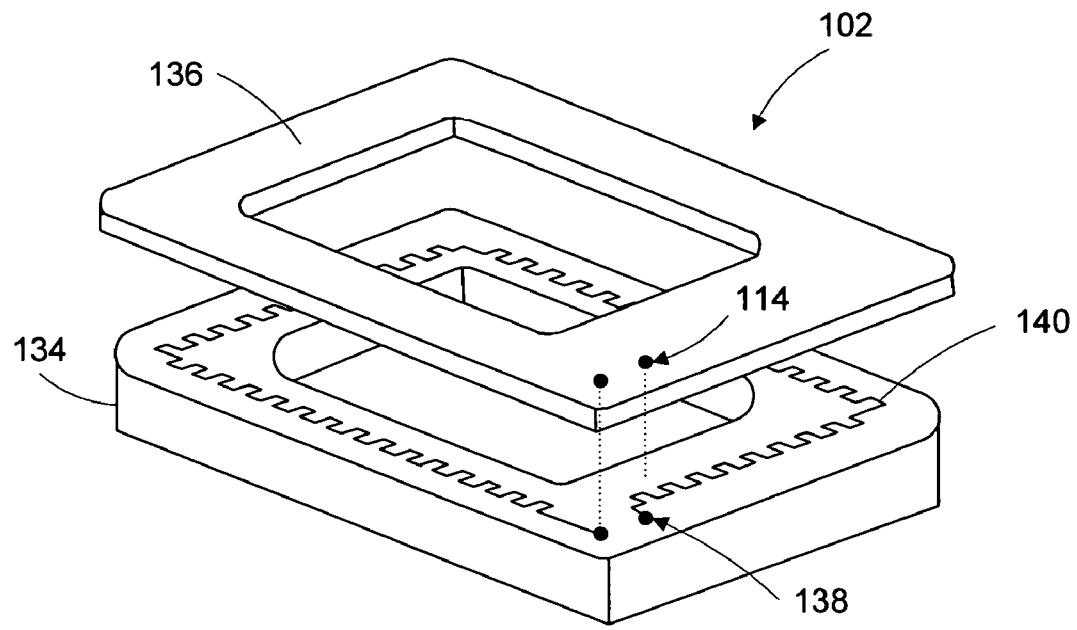
FIG. 3 schematically illustrates a packaging substrate having an embedded heater for the package in FIG. 1.
Figure 4:
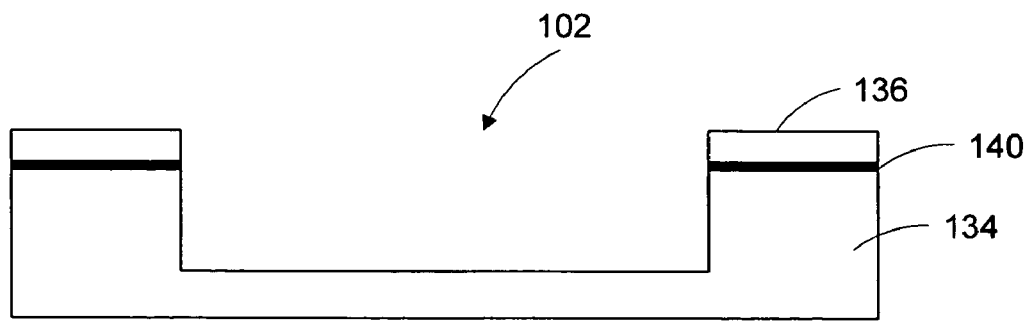
FIG. 4 is a cross-sectional view of the package substrate of FIG. 3.

Referring to FIG. 3, a packaging substrate with an integral heater for use in the package of FIG. 1 is illustrated therein. Packaging substrate 102 comprises substrate layer 134 and substrate layer 136. Substrate layer 134 has a concave surface that forms a cavity in which microstructure (e.g. micromirror array device) or semiconductor device can be placed. On substrate layer 134, heater 140 is formed along the periphery of the concave surface of substrate layer 134. Electric current from external electric power source can be introduced into the heater via two leads 138 so as to generating heat. The heater is laminated between substrate layers 134 and 136. A cross-sectional view of packaging substrate 200 is illustrated in FIG. 4.

In this particular example, the heater has zigzag edges. Alternatively, the heater can take any other suitable forms, such as a set of consecutively connected straight lines or disconnected lines each having leads at each end, coils or combinations of lines and coils or zigzag lines. Moreover, other than forming the heater on substrate layer 140 which comprises a cavity for accommodating micromirror array devices, the heater can also be formed on substrate 136. In particular, the heater can be formed on substrate 136 and on the surface that faces substrate 134. As will be seen in FIG. 5, substrate 136 may not be necessary, and if not provided, the heater is patterned on or otherwise integral with substrate 134. The heater can be made of any suitable materials, such as tungsten, and can be formed by any suitable methods (e.g. sputtering and electro-plating) for making a thin film and standard methods (e.g. printing) for making a thick film. In order to generating heat, electric current is driven through the two leads. Alternatively, the electric current can also be introduced into the heater through the leads which are formed on substrate layer 134 and connected to the two leads respectively.

Substrate layers 134 and 136 can be any suitable preferably non-electrically conducting materials, preferably ceramic or glass, and more preferably ceramic (e.g. $AlO_2$). Other materials (e.g. organic or hybrid organic-inorganic materials) could also be used depending upon their melting points. In another embodiment of the invention, substrate layers 134 and 136 each can be a multilayered structure that further comprises a plurality of substrate layers. In this situation, the top layer, on which the heater is disposed, of substrate 134 and the bottom layer, which face the heater, of substrate 136 are preferably non-electrically conducting. Other layers, including the substrate layers underneath the top layer of substrate 134 and the substrate layers above the bottom layer of substrate 136 can be any desired materials, such as ceramic, glass and metallic materials.

Figure 5:
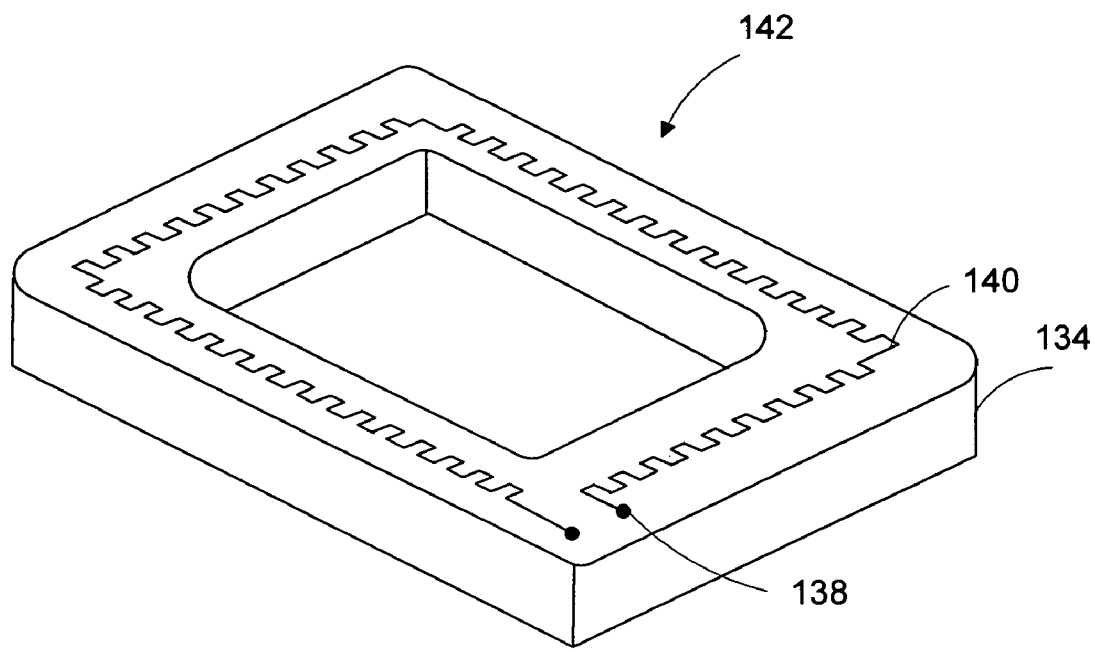
FIG. 5 is a diagram schematically illustrating another packaging substrate for packaging a micromirror array device, the packaging substrate having a heater formed along the periphery of the top surface of the packaging substrate.
Figure 6:
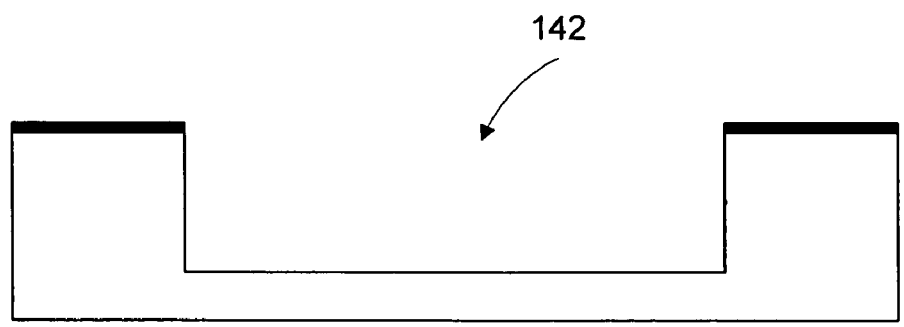
FIG. 6 is a cross-sectional view of the packaging substrate of FIG. 5.

Other than embedding the heater underneath the surface of the packaging substrate, the heater can be formed on the surface of the packaging substrate as shown in FIGS. 5 and 6. Referring to FIG. 5, the heater is formed along the surface of substrate 134, and no other substrate layer is formed thereon. Substrate 134 could be a multilayered structure. The heater is directly exposed to other materials, such as sealing mediums, and structures, such as other packaging substrates. In this situation, the sealing medium deposited on the heater is preferably non-electrically conducting materials, such as glass frit. If a metallic sealing material is selected, the heater exposed on the surface of the package substrate surface is desired to be covered by a non-electric conducting layer, which preferably has a high thermo-conductivity.

Referring back to FIG. 1, during the bonding process, an electric current is driven through the integral heater via the two heater leads (114) for generating heat. The amplitude of the electric voltage is dominated by electric characteristics of the heater (e.g. electric properties of the material of the heater, the shape of the heater), thermal characteristics and geometry of the substrate layers of packaging substrate 102 and the desired temperature on the surface of the packaging substrate for melting the metallization layer(s) (e.g. 104) and sealing medium (e.g. sealing medium layer 106). As an example, the melting temperature, also the desired temperature on the surface of the packaging substrate, of sealing medium 106 is from 100 to 300° C. degrees, preferably 180° C. degrees or higher, or 270° C. degrees or higher. The heater is embedded underneath the surface of the packaging substrate at a distance preferably from 1 millimeter to 10 millimeters, preferably around 7 millimeters. In this example, the packaging substrate is ceramic. Then the voltage set up between the two heater leads 114 is preferably from 40 to 100 volts, preferably around 70 volts. In other words, this voltage causes the heater generating heat with an amount that raises the surface temperature of the packaging substrate to the melting temperature of the sealing medium layer. As a result, sealing medium is melted and used to bond the cover substrate and packaging substrate. Meanwhile, the temperature at the micromirror device location is far less than the temperature that causes mechanical failure of the micromirrors of the micromirror device. In the embodiment of the invention, the temperature at the micromirror device location is preferably less than 70° C. during bonding.

In another embodiment of the invention, the cover substrate (110) may also have a heater. Such a heater in the cover substrate can be formed along the periphery of the surface of the cover substrate and embedded underneath said surface of the cover substrate. This heater in the cover substrate can be used in bonding the cover substrate and the package substrate. And it is especially useful in soldering the metallization medium layer (e.g. 108) and the sealing medium layer.

For further avoiding heating effects on the packaged microstructure or semiconductor device, an external cooling mechanism, such as a cooling plate can be employed for dissipating heat from the package. For example, a cooling plate can be attached to the package substrate.

Figure 7:
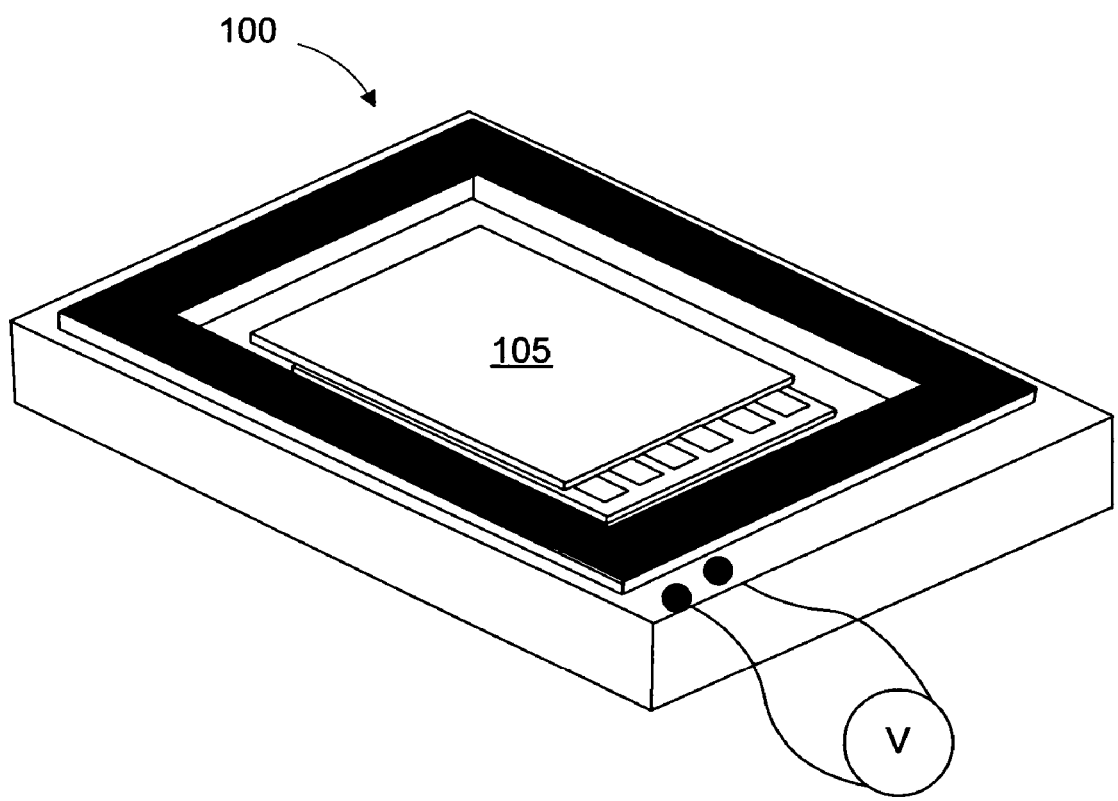
FIG. 7 is a perspective view of a packaged micromirror array device.

The package of the present invention has a variety of applications (e.g. microstructures, semiconductors, light emitting devices such as LEDs and OLEDs, light modulators, such as LCOS devices, LCD devices, plasma devices, and micromirror devices, light detecting devices, such as CCDs etc), one of which is in display systems. FIG. 7 illustrates an exemplary micromirror array package according to an embodiment of the invention. The micromirror array device is bonded with in the package for protection. Incident light can travel through the cover substrate and shine on the micromirrors of the micromirror array device. This package can then be employed in practical applications, one of which is display systems.

Figure 8A:
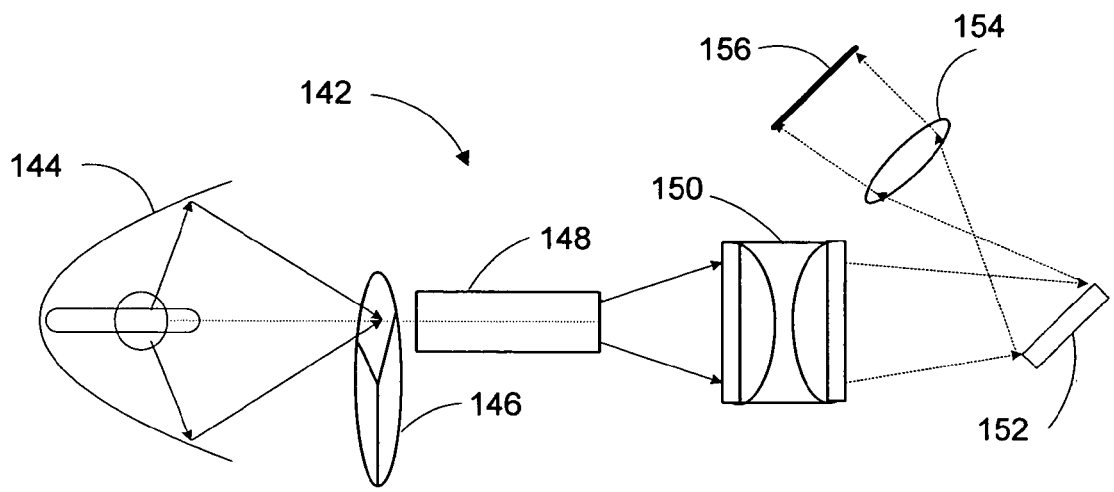
FIG. 8a is a simplified display system employing the packaged micromirror array device of FIG. 7.

Referring to FIG. 8a, a typical display system employing a micromirror array device package of FIG. 7 is illustrated therein. In its very basic configuration, the display system comprises light source 144, optical devices (e.g. light pipe 148, lens 150 and 154), color wheel 146, display target 156 and spatial light modulator 152 that uses micromirror array device package of FIG. 7. The light source (e.g. an arc lamp) directs incident light through the color wheel and optical devices (e.g. the light pipe and object lens) and shines on the spatial light modulator. The spatial light modulator selectively reflects the incident light toward optical device 154 and results in an image on the display target. The display system can be operated in many ways, such as those set forth in U.S. Pat. No. 6,388,661, and U.S. patent application Ser. No. 10/340,162, filed on Jan. 10, 2003, both to Richards, the subject matter of each being incorporated herein by reference.

Figure 8B:
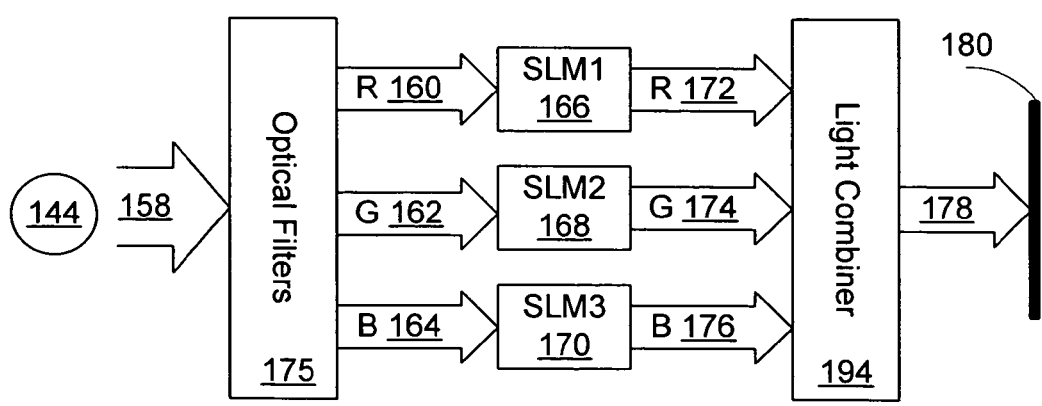
FIG. 8b is a block diagram illustrating an exemplary operation of a display system employing three packaged micromirror array devices of FIG. 7.

Referring to FIG. 8b, a block diagram illustrating a display system employing three spatial light modulators, each having a micromirror array device package of FIG. 7, is shown, wherein each spatial light modulator is designated for respectively modulating the three primary color (i.e. red, green and blue) light beams. As shown, light 158 from light source 144 passes through optical filters 175 and is split into three primary color light beams, that is, red light 160, green light 162 and blue light 164. Each color light beam impinges a separate spatial light modulator and is modulated thereby. Specifically, red light 160, green light 162, and blue light 164 respectively impinge spatial light modulators 166, 168 and 170 and are modulated. The modulated red light 172, green light 174, and blue light 176 are recombined at light combiner 194 for forming modulated color images. Combined color light 178 is directed (e.g. by projection lens) onto display target 180 for viewing.

Figure 9A:
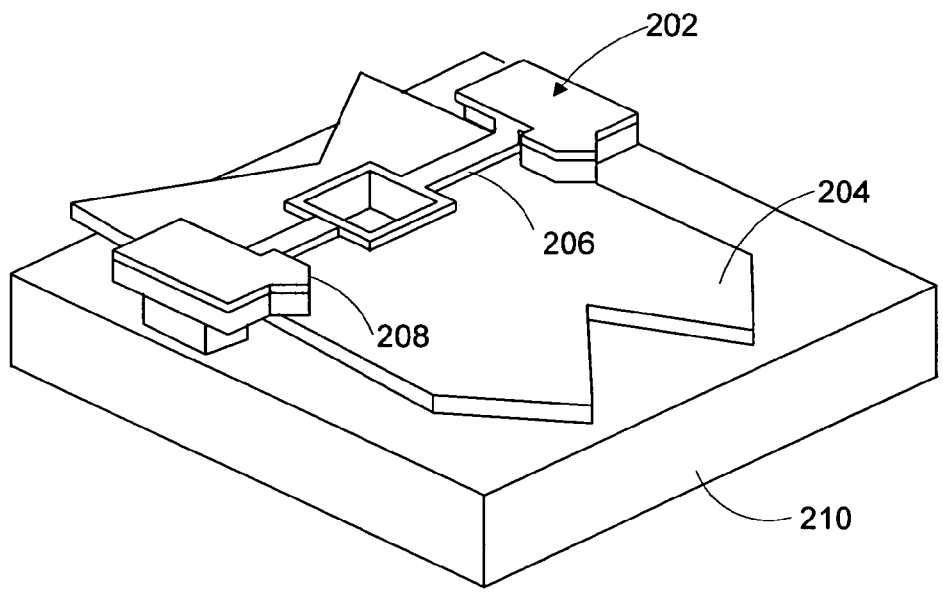
FIG. 9a is a diagram schematically illustrating an exemplary micromirror of the micromirror array.
Figure 9B:
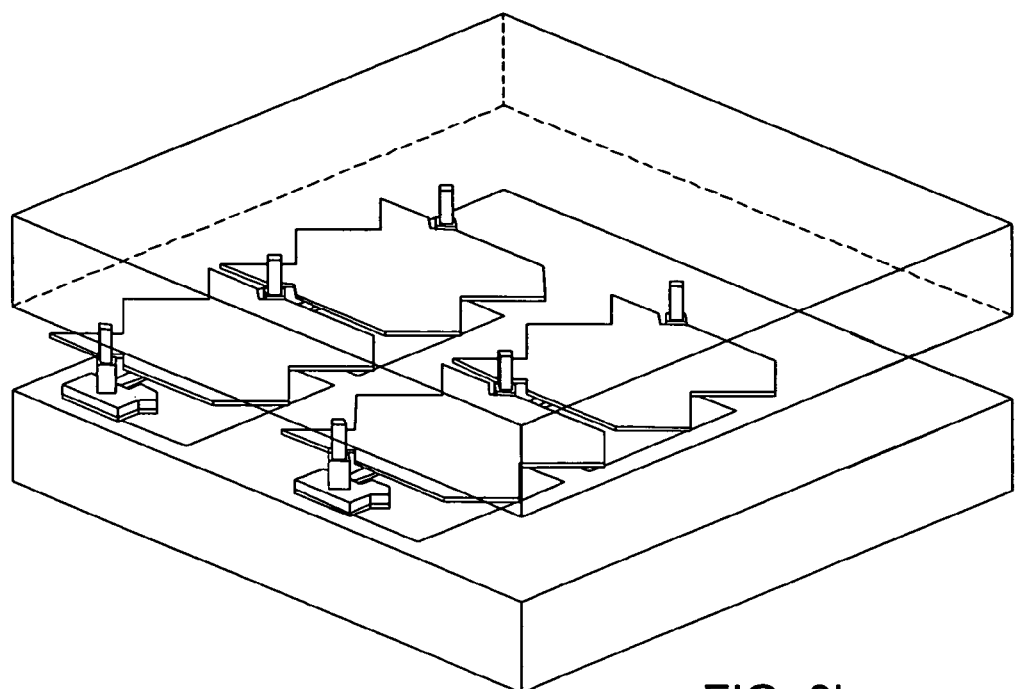

Referring to FIG. 9a, an exemplary micromirror device of the micromirror array device is illustrated therein. As seen, micromirror plate 204 is attached to hinge 206. The hinge is held by posts 202 that are formed on substrate 210. With this configuration, the micromirror plate can rotate above the substrate along the hinge. As alternative feature, two stoppers (e.g. stopper 208) are formed for controlling the rotation of the micromirror plate. The substrate is preferably glass. Alternatively, substrate 210 can be a semiconductor wafer, on which standard DRAM circuitry and electrodes can be constructed. In yet another embodiment of the invention, the micromirror substrate can be formed on a transfer substrate that is light transmissive. Specifically, the micromirror plate can be formed on the transfer substrate and then the micromirror substrate along with the transfer substrate is attached to another substrate such as a light transmissive substrate followed by removal of the transfer substrate and patterning of the micromirror substrate to form the micromirror. FIG. 9b illustrates a portion of a micromirror array comprising a plurality of micromirror devices in FIG. 9a. The array is formed on the upper substrate which is preferably light transparent glass. The lower substrate, which is preferably a semiconductor wafer, is formed thereon an array of electrodes and circuitry for electrostatically controlling the rotation of the micromirrors in the upper substrate. Other than forming the micromirror array and the electrode and circuitry array on different substrates as discussed above, they can be fabricated on the same substrate.

Figure 10A:
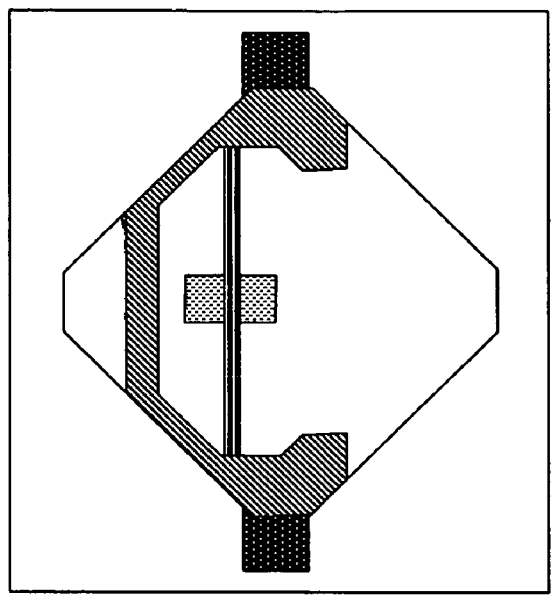
FIG. 10a is a diagram schematically illustrating another exemplary micromirror of the micromirror array.
Figure 10B:
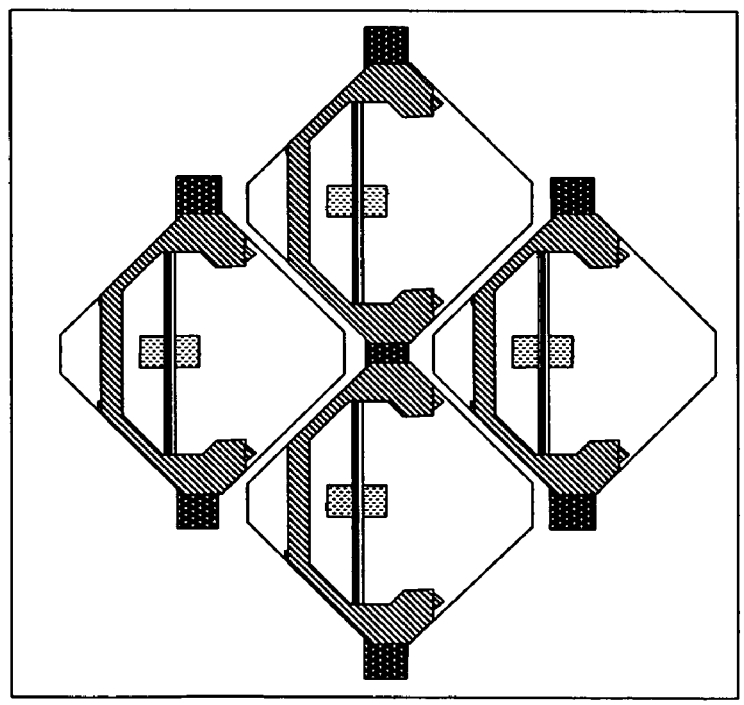

FIGS. 9a and 9b illustrate an exemplary micromirror device having a micromirror plate with zigzag edges. The micromirror plate can be of any desired shape. Another exemplary micromirror device with a different configuration is illustrated in FIG. 10a. Referring to FIG. 10a, the micromirror plate has a "diamond" shape. The hinge is arranged parallel to but off-set from a diagonal of the micromirror plate. It is worthwhile to point out that the hinge structure has an arm that is extended towards one end of the micromirror plate. The entire hinge structure and the hinge are formed underneath the micromirror plate. This configuration has many benefits, such as reducing the refraction of the incident light by the hinge and the hinge structure. FIG. 10b illustrates an exemplary micromirror array device composed of a plurality of micromirror devices of FIG. 10a.

It will be appreciated by those skilled in the art that a new and useful method of packaging microstructure and semiconductor devices has been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. In particular, other protective materials, such as inert gas, may be filled in the space formed by the package substrate and the cover substrate. For another example, the package substrate, as well as the cover substrate and the spacer, can be other suitable materials, such as silicon dioxide, silicon carbide, silicon nitride, and glass ceramic. For yet another example, other suitable auxiliary methods and components, such as applications of Infrared Radiation during bonding for soldering the sealing medium layers, and pillars or other structures for aligning the substrates are also applicable. Moreover, other desired materials, such as anti-stiction material, preferably in vapor phase for reducing stiction of the micromirrors of the micromirror array device, may also be deposited inside the package. The anti-stiction material can be deposited before bonding the cover substrate and lower substrate. When the cover substrate is glass that is visible light transmissive, it can be placed parallel to the micromirror array device and the package substrate. Alternatively, the cover substrate may be placed at an angle with the micromirror array device or the package substrate. Therefore, the invention as described herein contemplates all such embodiments as may come within the scope of the following claims and equivalents thereof.

I claim:

1. A package, comprising:
    a ceramic package substrate that comprises a plurality of ceramic layers forming a cavity having a supporting surface on which a microelectromechanical device formed on a second substrate that is bonded to the ceramic package substrate;
    a package lid that has at least a portion that is transmissive to visible light;
    a first metallization layer comprising a first metallization material on a surface of the ceramic package substrate, the first metallization layer being electrically isolated from circuitry within the ceramic package substrate;
    a second metallization layer comprising a second metallization material on a surface of the package lid;
    a solder bonding the ceramic package substrate to the package lid; and
    an embedded heater laminated between first and second ceramic layers of the ceramic package substrate, wherein the heater extends within the ceramic package substrate with two ends of the heater electrically connected to at least two electrical connection pads outside the ceramic package substrate.

2. The package of claim 1, wherein the solder comprises $AuSn_x$.

3. The package of claim 1, wherein the solder comprises nickel.

4. The package of claim 1, wherein the microelectromechanical device is a spatial light modulator.

5. The package of claim 4, wherein spatial light modulator comprises an array of micromirrors.

6. The package of claim 1, wherein at least one of the first metallization layer or the second metallization layer is a multi-layer structure further comprising at least two metallization layers of different metallization materials.

7. The package of claim 6, wherein the different metallization-materials comprise gold and nickel.

8. The package of claim 1, wherein at least one of the first metallization material or the second metallization material comprises chromium.

9. The package of claim 1, wherein the heater is composed of tungsten.

10. The package of claim 8, wherein at least one of the first metallization material or the second metallization material further comprises chromium oxide.

11. The package of claim 1, wherein at least one of the first metallization material or the second metallization material comprises a chromium oxide layer.

12. The package of claim 1, wherein the package substrate comprises two ceramic layers.

13. The package of claim 1, wherein the ceramic layers are insulating layers.

14. The package of claim 5, wherein the spatial light modulator comprises:
    a light transmissive substrate on which an array of reflective and deflectable mirror plates are formed; and
    a semiconductor substrate on which an array of electrodes are disposed for moving the mirror plates.

15. The package of claim 5, wherein the spatial light modulator comprises an array of reflective and deflectable mirror plates formed on a semiconductor substrate on which an array of electrodes are formed.

16. A package comprising:
    a substrate with an opening, the substrate comprising a plurality of ceramic layers and the opening comprising a bottom surface;
    a microelectromechanical device located within the opening on the bottom surface;
    an at least partially transparent package lid attached to the substrate over the cavity, wherein the package lid and substrate are attached by a plurality of layers comprising a first metallization layer on the surface of the substrate;
    a second metallization layer on the surface of the package lid and electrically isolated from the rest of the package lid;
    a hermetic sealing material between the first metallization layer and the second metallization layer;
    wherein the plurality of layers are electrically isolated from circuitry within the substrate; and
    a heater in thermal connection with the hermetic sealing material such that the heater is capable of melting the hermetic sealing material, the heater comprising a first portion embedded within the plurality of ceramic layers and a second portion capable of being connected to an external electric power source.

17. The package of claim 16, wherein the hermetic sealing material is solder.

18. The package of claim 16, wherein the hermetic sealing material comprises glass frit.

19. The package of claim 16, wherein the hermetic sealing material comprises $AuSN_x$.

20. The package of claim 16, wherein the hermetic sealing material comprises nickel.

21. The package of claim 16, wherein the microelectromechanical device is a spatial light modulator.

22. The package of claim 21, wherein the spatial light modulator comprises an array of micromirrors.

23. The package of claim 21, wherein the spatial light modulator comprises:
    a light transmissive substrate on which an array of reflective and deflectable mirror plates are formed; and
    a semiconductor substrate on which an array of electrodes are disposed for moving the mirror plates.

24. The package of claim 21, wherein the spatial light modulator comprises an array of reflective and deflectable mirror plates formed on a semiconductor substrate on which an array of electrodes are formed.

25. The package of claim 16, wherein the wherein at least one of the first metallization layer or the second metallization layer comprises a gold layer and a nickel layer.

26. The package of claim 16, wherein at least one of the first metallization layer or the second metallization layer comprises chromium.

27. The package of claim 16, wherein at least one of the first metallization layer or the second metallization layer comprises chromium oxide.

28. The package of claim 16, wherein at least one of the first metallization layer or the second metallization layer comprises titanium oxide.

29. The package of claim 16, wherein at least one of the first metallization layer or the second metallization layer comprises gold.

30. The package of claim 16, wherein at least one of the first metallization layer or the second metallization layer comprises nickel.

31. The package of claim 16, wherein at least one of the first metallization layer or the second metallization layer comprises titanium.

32. The package of claim 16, wherein the wherein at least one of the first metallization layer or the second metallization layer comprises two or more metal layers.

33. The package of claim 32, wherein the two or more metal layers comprise a metal selected from the group consisting essentially of $CrO_2$, $TiO_2$, Cr, Au, Ni, and Ti.

34. The package of claim 16, wherein the heater is composed of tungsten.

35. The package of claim 16, wherein the substrate comprises two ceramic layers.

36. The package of claim 16, wherein the ceramic layers are insulating layers.

37. A package comprising:
a substrate comprising a plurality of ceramic layers and an embedded heater capable of being connected to an external power source;
a microelectromechanical device located within an opening of the substrate;
a lid over the opening and separated from the microelectromechanical device, the lid comprising at least a portion that is non-conductive and at least a portion that is transparent to light; and
a stacked layer of materials sealing the lid to the substrate, the stacked layer of materials electrically isolated from other portions of the lid by the non-conductive portion of the lid and comprising
a first metal in contact with a top layer of the plurality of ceramic layers,
a second metal in contact with the non-conductive portion of the lid, and
a melted solder between the first metal and the second metal,
wherein the heater is capable of melting the solder and sealing the lid to the substrate without causing thermal damage to the microelectromechanical device.

38. The package of claim 37, wherein the solder comprises $AuSN_x$.

39. The package of claim 37, wherein the solder comprises nickel.

40. The package of claim 37, wherein the microelectromechanical device is a spatial light modulator.

41. The package of claim 40, wherein the spatial light modulator comprises an array of micromirrors.

42. The package of claim 40, wherein the spatial light modulator comprises:
a light transmissive substrate on which an array of reflective and deflectable mirror plates are formed; and
a semiconductor substrate on which an array of electrodes are disposed for moving the mirror plates.

43. The package of claim 40, wherein the spatial light modulator comprises an array of reflective and deflectable mirror plates formed on a semiconductor substrate on which an array of electrodes are formed.

44. The package of claim 37, further comprising a third metal between the first metal and the solder.

45. The package of claim 44, wherein one of the first metal or the third metal comprises gold and the other of the first metal or second metal comprises nickel.

46. The package of claim 44, wherein one of the first metal or the third metal comprises a material selected from the group consisting essentially of $CrO_2$ and $TiO_2$.

47. The package of claim 44, wherein one of the first metal or the third metal comprises a material selected from the group consisting essentially of Cr, Au, Ni, and Ti.

48. The package of claim 37, further comprising a fourth metal between the second metal and the solder.

49. The package of claim 48, wherein one of the second metal or the fourth metal comprises a material selected from the group consisting essentially of $CrO_2$ and $TiO_2$.

50. The package of claim 48, wherein one of the second metal or the fourth metal comprises a material selected from the group consisting essentially of Cr, Au, Ni, and Ti.

51. The package of claim 37, wherein at least one of the first metal or the second metal comprises chromium.

52. The package of claim 37, wherein the heater is composed of tungsten.

53. The package of claim 37, wherein the substrate comprises two ceramic layers.

54. The package of claim 37, wherein the plurality of ceramic layers are insulating layers.

* * * * *